US009859290B1

(12) United States Patent
Wang et al.

(10) Patent No.: US 9,859,290 B1
(45) Date of Patent: Jan. 2, 2018

(54) MEMORY DEVICE AND METHOD FOR FABRICATING THE SAME

(71) Applicant: UNITED MICROELECTRONICS CORP., Hsin-Chu (TW)

(72) Inventors: Lanxiang Wang, Singapore (SG); Hong Liao, Singapore (SG); Chao Jiang, Singapore (SG); Bo Liu, Singapore (SG); Xin Xu, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 11 days.

(21) Appl. No.: 15/342,098

(22) Filed: Nov. 2, 2016

(51) Int. Cl.
| | |
|---|---|
| H01L 21/336 | (2006.01) |
| H01L 27/11521 | (2017.01) |
| H01L 29/49 | (2006.01) |
| H01L 29/423 | (2006.01) |
| H01L 23/522 | (2006.01) |
| H01L 27/08 | (2006.01) |
| H01L 29/92 | (2006.01) |
| H01L 27/108 | (2006.01) |
| H01L 27/11502 | (2017.01) |

(52) U.S. Cl.
CPC .. *H01L 27/11521* (2013.01); *H01L 29/42324* (2013.01); *H01L 29/4966* (2013.01); *H01L 23/5223* (2013.01); *H01L 27/0805* (2013.01); *H01L 27/10852* (2013.01); *H01L 27/11502* (2013.01); *H01L 29/92* (2013.01); *H01L 2924/30105* (2013.01)

(58) Field of Classification Search
CPC ......... H01L 27/11521; H01L 29/42324; H01L 29/4966
USPC ................................................. 438/264
See application file for complete search history.

(56) References Cited

U.S. PATENT DOCUMENTS

| | | | | |
|---|---|---|---|---|
| 7,535,758 | B2* | 5/2009 | Bergemont | G11C 16/0416 257/315 |
| 8,796,128 | B2* | 8/2014 | Edge | H01L 21/82345 257/392 |
| 2015/0091073 | A1* | 4/2015 | Li | H01L 29/7881 257/316 |
| 2016/0005749 | A1* | 1/2016 | Li | H01L 27/11521 257/295 |
| 2016/0211849 | A1* | 7/2016 | Shin | H03K 19/16 |

OTHER PUBLICATIONS

Khan et al, understanding negative capacitance dynamics in ferroelectric capacitors, Oct. 30, 2015.
Khan et al, Ferroelectric negative capacitance MOSFET: capacitance tuning & antiferroelectric operation, Dec. 2011.
Chen, Title of Invention: Semiconductor Device, U.S. Appl. No. 15/206,319, filed Jul. 11, 2016.

\* cited by examiner

*Primary Examiner* — Vu A Vu
(74) *Attorney, Agent, or Firm* — Winston Hsu

(57) ABSTRACT

A method for fabricating memory device includes the steps of: providing a substrate; forming a tunnel oxide layer on the substrate; forming a first gate layer on the tunnel oxide layer; forming a negative capacitance (NC) insulating layer on the first gate layer; and forming a second gate layer on the NC insulating layer. Preferably, the second gate layer further includes a work function metal layer on the NC insulating layer and a low resistance metal layer on the work function metal layer.

19 Claims, 3 Drawing Sheets

MEMORY DEVICE AND METHOD FOR FABRICATING THE SAME

BACKGROUND OF THE INVENTION

1. Field of the Invention

The invention relates to a method for fabricating a memory device, and more particularly to a method of forming a negative capacitance (NC) insulating layer between floating gate and control gate of the memory device.

2. Description of the Prior Art

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased electrically.

Product development efforts in memory device technology have focused on increasing the programming speed, lowering programming and reading voltages, increasing data retention time, reducing cell erasure times and reducing cell dimensions. Some of the flash memory arrays today utilize a gate structure made of dual polysilicon layers (also refers to as the dual poly-Si gate). The polysilicon layer utilized in these gate structures often includes a dielectric material composed of an oxide-nitride-oxide (ONO) structure. When the device is operating, electrons are injected from the substrate into the bottom layer of the dual polysilicon layers for storing data. Since these dual gate arrays typically store only one single bit of data, they are inefficient for increasing the capacity of the memory. As a result, a flash memory made of silicon-oxide-nitride-oxide-silicon (SONOS) is derived. Preferably, a transistor from these memories is capable of storing two bits of data simultaneously, which not only reduces the size of the device but also increases the capacity of the memory significantly.

Despite the common utilization of these devices, current flash memory devices normally require high voltages in operations such as programming and erasing. Although $V_{DD}$ of logic device scales, the operation voltage of flash memory does not. Hence, how to improve the current fabrication process for resolving this issue has become an important task in this field.

SUMMARY OF THE INVENTION

According to a preferred embodiment of the present invention, a method for fabricating memory device includes the steps of: providing a substrate; forming a tunnel oxide layer on the substrate; forming a first gate layer on the tunnel oxide layer; forming a negative capacitance (NC) insulating layer on the first gate layer; and forming a second gate layer on the NC insulating layer.

According to another aspect of the present invention, a memory device includes: a tunnel oxide layer on a substrate; a first gate layer on the tunnel oxide layer; a negative capacitance (NC) insulating layer on the first gate layer; and a second gate layer on the NC insulating layer. Preferably, the second gate layer further includes a work function metal layer on the NC insulating layer and a low resistance metal layer on the work function metal layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
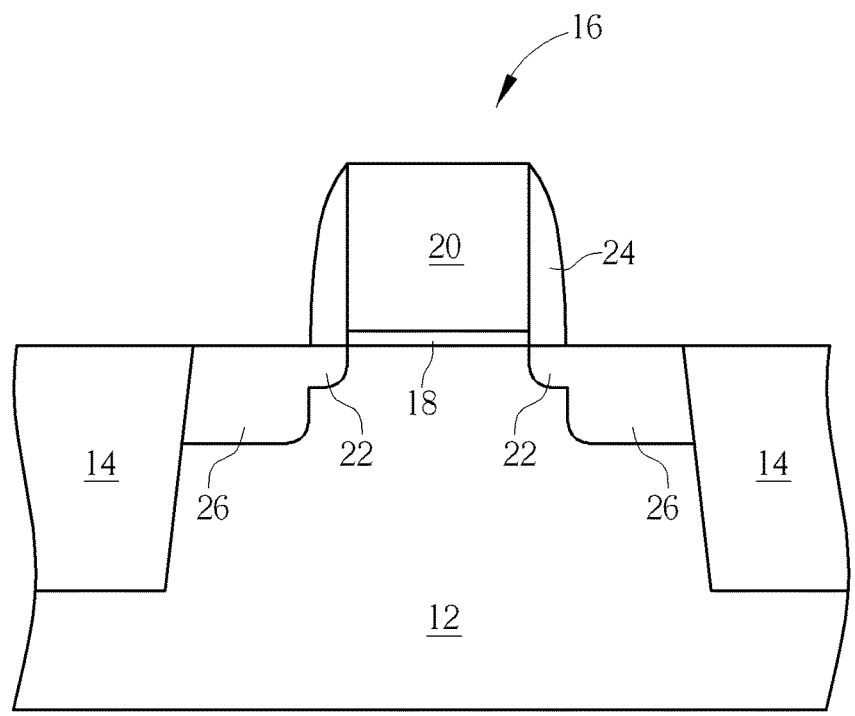
FIGS. 1-4 illustrate a method for fabricating a flash memory according to a preferred embodiment of the present invention.

Referring to FIGS. 1-4, FIGS. 1-4 illustrate a method for fabricating a flash memory according to a preferred embodiment of the present invention. As shown in FIG. 1, a substrate 12 is provided, a shallow trench isolation (STI) 14 is formed in the substrate 12 to define a memory region, and at least a dummy gate or gate structure 16 is formed on the substrate 12.

Preferably, the formation of the gate structure 16 could be accomplished by a gate first process, a high-k first approach from gate last process, or a high-k last approach from gate last process. Since this embodiment pertains to an analogous high-k last approach typically carried out in a metal-oxide semiconductor (MOS) transistor fabrication, it would be desirable to sequentially deposit a gate dielectric layer or interfacial layer, a gate material layer, and a selective hard mask on the substrate 12, conduct a pattern transfer process by using a patterned resist (not shown) as mask to remove part of the gate material layer and part of the gate dielectric layer, and then strip the patterned resist to form dummy gate or gate structure 16 on the substrate 12. The gate structure 16 preferably includes a patterned gate dielectric layer 18 and a patterned material layer 20.

In this embodiment, the substrate 12 could be a semiconductor substrate such as a silicon substrate, an epitaxial substrate, a SiC substrate, or a silicon-on-insulator (SOI) substrate, but not limited thereto. The gate dielectric layer 18 could include $SiO_2$, SiN, or high-k dielectric material and the gate material layer 20 could include metal, polysilicon, or silicide.

It should be noted that even though this embodiment pertains to the fabrication of a planar flash memory device, it would also be desirable to apply the process of the present invention to a non-planar device and in such instance, the substrate 12 shown in FIG. 1 would become a fin-shaped structure formed atop a substrate, which is also within the scope of the present invention.

Preferably, the fin-shaped structure could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, a lightly doped drain (LDD) 22 is formed adjacent two sides of the gate structure 16, at least a spacer 24 is formed on the sidewalls of the gate structure 16, and a source/drain region 26 and/or epitaxial layer (not shown) is formed in the substrate 12 adjacent to two sides of the spacer 24. In this embodiment, the spacer 24 could be a single spacer or a composite spacer. For instance, the spacer 24 could further include an offset spacer (not shown) and a main spacer (not shown), and the spacer 24 could be selected from the group consisting of $SiO_2$, SiN, SiON, and SiCN. The lightly doped drain 22, source/drain region 26, and epitaxial layer could include different dopants or different material depending on the type of transistor being fabricated. For instance, the lightly doped drain 22 and the source/drain region 26 could include p-type or n-type dopants and the epitaxial layer could include SiGe, SiC, or SiP.

Figure 2:
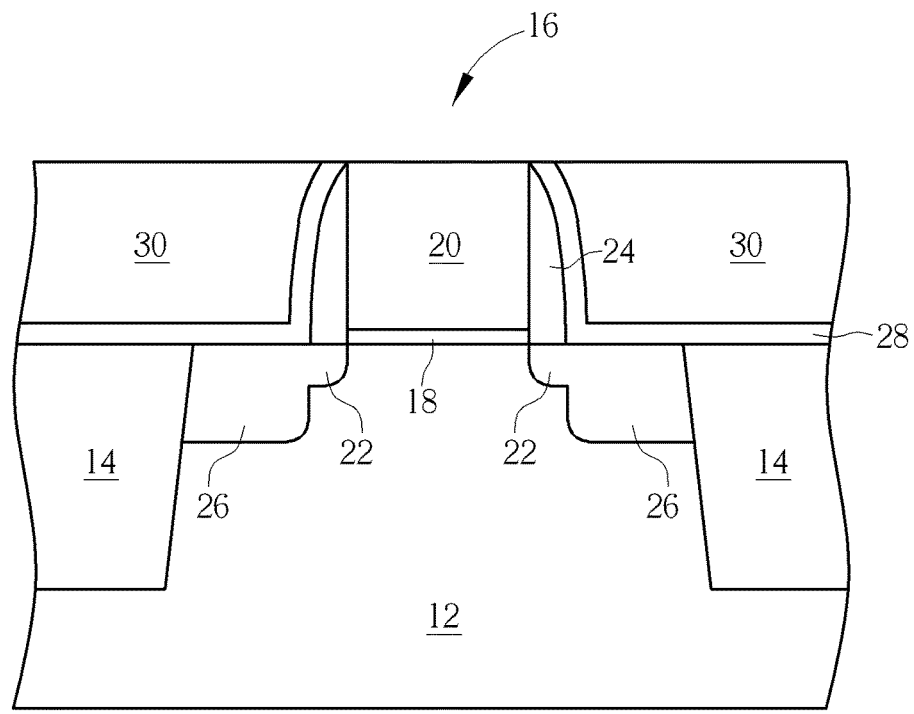
Figure 3:
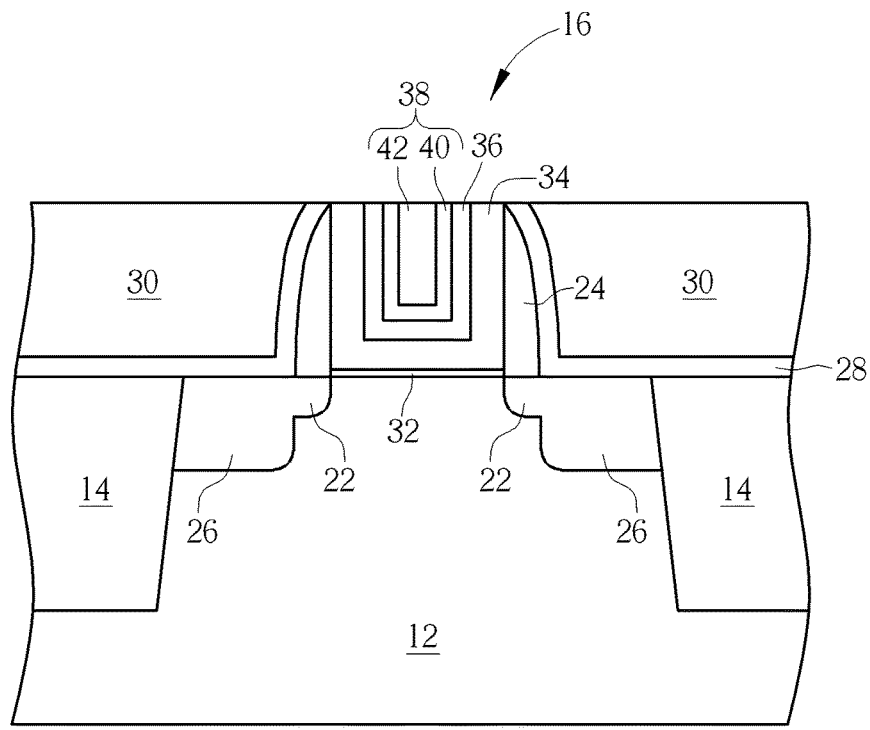

Next, as shown in FIG. 2, an optional contact etch stop layer (CESL) 28 composed of silicon nitride could be selectively formed on the substrate 12 to cover the gate structure 16, and an interlayer dielectric (ILD) layer 30 is formed on the CESL 28. Next, a planarizing process, such as chemical mechanical polishing (CMP) process is conducted to remove part of the ILD layer 30 and part of the CESL 28 to expose the gate material layer 20 composed of polysilicon so that the top surface of the gate material layer 20 and the top surface of the ILD layer 30 are coplanar.

Next, a replacement metal gate (RMG) process is conducted to transform the gate structure 16 into metal gate. The RMG process could be accomplished by first performing a selective dry etching or wet etching process, such as using etchants including ammonium hydroxide ($NH_4OH$) or tetramethylammonium hydroxide (TMAH) to remove the gate material layer 20 for forming a recess (not shown) in the ILD layer 30. Preferably, the gate dielectric layer 18 or interfacial layer underneath the gate material layer 20 may be removed along with the gate material layer 20 during the etching process, however it would also be desirable to not removing all of the gate dielectric layer 18 depending on the demand of the process.

After the surface of the substrate 12 within the recess is exposed, a pre-clean process could be conducted to remove native oxides or un-wanted residues in the recess, and an optional new gate dielectric layer (not shown) or interfacial layer could be re-deposited on the surface of the substrate 12. Next, a tunnel oxide layer 32 is formed either on the gate dielectric layer (not shown) or directly on the surface of the substrate 12, a first gate layer 34 is formed on the tunnel oxide layer 32, a negative capacitance (NC) insulating layer 36 is formed on the first gate layer 34, and a second gate layer 38 is formed on the NC insulating layer 36.

In this embodiment, the tunnel oxide layer 32 could include material such as, for example but not limited to $SiO_2$, SiON, a high-k dielectric layer, or combination thereof. The high-k dielectric layer is preferably selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Preferably, the first gate layer 34 is utilized as a floating gate for the flash memory of the present embodiment, in which the first gate layer 34 could include metals or metal nitrides such as, for example but not limited to Al, Ti, Ta, W, Nb, Mo, Cu, TiN, TiC, TaN, Ti/W, Ti/TiN, or combination thereof. Alternatively, it would also be desirable to use semiconductor material such as polysilicon for the first gate layer 34, which is also within the scope of the present invention.

The NC insulating layer 36 sandwiched between the first gate layer 34 (or floating gate) and the second gate layer 38 (or control gate) could be used to achieve a gate coupling ratio (GCR) of greater than one, thereby reaching substantially higher voltages in normal operations for the device. In this embodiment, the NC insulating layer 36 preferably includes material such as, for example but not limited to $HfZrO_x$, $PbZrTiO_x$, $BiFeO_3$, a copolymer of poly(vinylidene fluoride) (PVDF) and trifluoroethylene (TrFE), or combination thereof. Among which, it should be noted that the copolymer of poly(vinylidene fluoride) (PVDF) and trifluoroethylene (TrFE) utilized in this embodiment specifically pertains to a copolymer of poly(vinylidene fluoride) (PVDF) and trifluoroethylene (TrFE) in a 75:25 ratio.

Specifically, each of the aforementioned candidates is grown through a preferable deposition method. For example, a NC insulating layer 36 made of $HfZrO_x$ or $PbZrTiO_x$ is preferably formed by an atomic layer deposition (ALD) process, a NC insulating layer made of $BiFeO_3$ is preferably formed an epitaxial process, and a NC insulating layer made of copolymer of poly(vinylidene fluoride) (PVDF) and trifluoroethylene (TrFE) in a 75:25 ratio is preferably formed by a spin coating process.

The second gate layer 38 disposed on top of the NC insulating layer 36 is preferably used as control gate for the flash memory, in which the second gate layer 38 and the first gate layer 34 could be made of same or different material, and the second gate layer 38 could be a single-layered structure or could include a work function metal layer 40 and a low resistance metal layer 42 as disclosed in this embodiment.

If the second gate layer 38 were to include only a single layer, the second gate layer 38 could include metals or metal nitrides such as, for example but not limited to Al, Ti, Ta, W, Nb, Mo, Cu, TiN, TiC, TaN, Ti/W, Ti/TiN, or combination thereof.

In this embodiment, the work function metal layer 40 could include either a n-type work function metal layer or a p-type work function metal layer. For example, a n-type work function metal layer having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. A p-type work function metal layer having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 40 and the low resistance metal layer 42, in which the material of the barrier layer may include titanium (Ti), titanium nitride (TiN), tantalum (Ta) or tantalum nitride (TaN). The material of the low-resistance metal layer 42 may include copper (Cu), aluminum (Al), titanium aluminum (TiAl), cobalt tungsten phosphide (CoWP) or any combination thereof.

Figure 4:
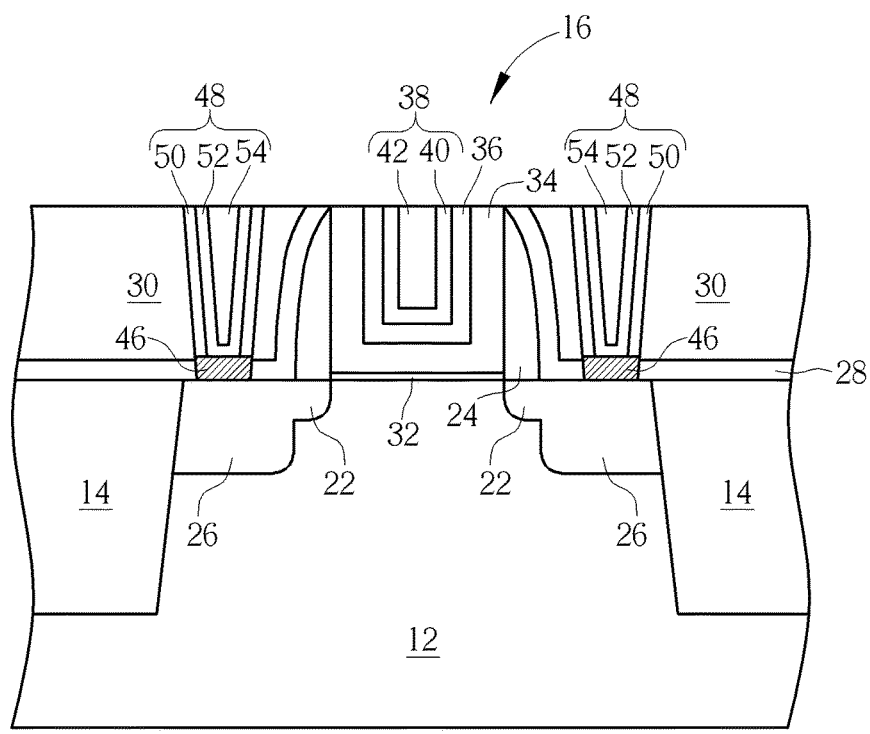

Next, as shown in FIG. 4, a contact plug formation is conducted with silicide process to form silicides 46 and contact plugs 48 electrically connected to the source/drain region 26 adjacent to two sides of the gate structure 16. In this embodiment, the contact plug formation could be accomplished by first conducting an etching process to remove part of the ILD layer 30 to form contact holes (not shown) exposing the substrate 12 surface. Next, a first metal layer 50 and a second metal layer 52 are deposited in sequence in the contact holes, in which the first metal layer 50 and the second metal layer 52 are formed conformally on the surface of the substrate 12 and inner sidewalls of the contact hole. In this embodiment, the first metal layer 50 is selected from the group consisting of Ti, Co, Ni, and Pt, and most preferably Ti, and the second metal layer 52 is selected from the group consisting of TiN and TaN.

After depositing the first metal layer 50 and second metal layer 52, a first thermal treatment process and a second thermal treatment process are conducted sequentially to form silicides 46 on the source/drain region 26. In this embodiment, the first thermal treatment process includes a soak anneal process, in which the temperature of the first thermal treatment process is preferably between 500° C. to 600° C., and most preferably at 550° C., and the duration of the first thermal treatment process is preferably between 10 seconds to 60 seconds, and most preferably at 30 seconds. The second thermal treatment process includes a spike anneal process, in which the temperature of the second thermal treatment process is preferably between 600° C. to 950° C., and most preferably at 600° C., and the duration of the second thermal treatment process is preferably between 100 milliseconds to 5 seconds, and most preferably at 5 seconds.

After the two thermal treatment processes are conducted, a third metal layer 54 is deposited to fill the contact holes completely. In this embodiment, the third metal layer 54 is composed of tungsten, but not limited thereto. Next, a planarizing process, such as a CMP process is conducted to remove part of the third metal layer 54, part of the second metal layer 52, and part of the first metal layer 50, and depending on the demand of the process also removing part of the ILD layer 30 for forming contact plugs 48 electrically connected to the source/drain region 26. This completes the fabrication of a flash memory device according to a preferred embodiment of the present invention.

Figure 5:
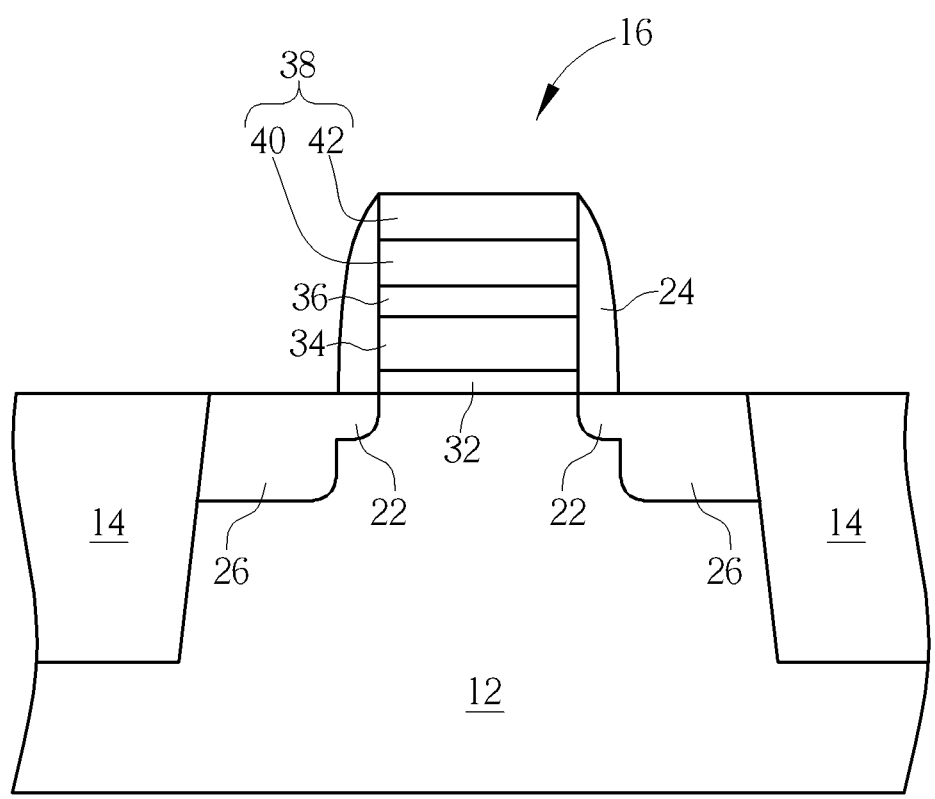
FIG. 5 illustrates a method for fabricating a flash memory according to an embodiment of the present invention.

It should be noted that since the aforementioned embodiment for fabricating the memory device pertains to a high-k last approach, each of the first gate layer 34, NC insulating layer 36, and the second gate layer 38 from the gate stack of the device preferably includes a U-shaped cross-section. Nevertheless, according to an embodiment of the present invention, it would also be desirable to employ a gate first or high-k first approach to fabricate the gate stack containing the aforementioned first gate layer 34, NC insulating layer 36, and second gate layer 38, and in such instance, each of the first gate layer 34, NC insulating layer 36, and second gate layer 38 would reveal an I-shaped cross-section, as shown in FIG. 5.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating memory device, comprising:
providing a substrate;
forming a tunnel oxide layer on the substrate;
forming a first gate layer on the tunnel oxide layer, wherein the first gate layer is U-shaped;
forming a negative capacitance (NC) insulating layer on the first gate layer; and
forming a second gate layer on the NC insulating layer, wherein a top surface of the second gate layer is even with a top surface of the first gate layer.

2. The method of claim 1, wherein the tunnel oxide layer comprises $SiO_2$, SiON, or a high-k dielectric layer.

3. The method of claim 1, wherein the first gate layer comprises polysilicon.

4. The method of claim 1, wherein the NC insulating layer comprises $HfZrO_x$, $PbZrTiO_x$, $BiFeO_3$, or a copolymer of poly(vinylidene fluoride) (PVDF) and trifluoroethylene (TrFE).

5. The method of claim 1, wherein the second gate layer comprises polysilicon.

6. The method of claim 1, wherein the second gate layer comprises metal.

7. The method of claim 6, wherein the second gate layer comprises:
a work function metal layer on the NC insulating layer; and
a low resistance metal layer on the work function metal layer.

8. The method of claim 1, further comprising forming a source/drain region in the substrate before forming the tunnel oxide layer.

9. The method of claim 1, further comprising performing an anneal process after forming the NC insulating layer.

10. The method of claim 1, further comprising forming a contact etch stop layer (CESL) on the substrate and the second gate layer.

11. A memory device, comprising:
a tunnel oxide layer on a substrate;
a first gate layer on the tunnel oxide layer, wherein the first gate layer is U-shaped;
a negative capacitance (NC) insulating layer on the first gate layer; and
a second gate layer on the NC insulating layer, wherein a top surface of the second gate layer is even with a top surface of the first gate layer.

12. The memory device of claim 11, wherein the tunnel oxide layer comprises $SiO_2$, SiON, or a high-k dielectric layer.

13. The memory device of claim 11, wherein the first gate layer comprises polysilicon.

14. The memory device of claim 11, wherein the NC insulating layer comprises $HfZrO_x$, $PbZrTiO_x$, $BiFeO_3$, or a copolymer of poly(vinylidene fluoride) (PVDF) and trifluoroethylene (TrFE).

15. The memory device of claim 11, wherein the second gate layer comprises polysilicon.

16. The memory device of claim 11, wherein the second gate layer comprises metal.

17. The memory device of claim 16, wherein the second gate layer comprises:
- a work function metal layer on the NC insulating layer; and
- a low resistance metal layer on the work function metal layer.

18. The memory device of claim 11, further comprising a source/drain region in the substrate and adjacent to two sides of the tunnel oxide layer.

19. The memory device of claim 11, further comprising a contact etch stop layer (CESL) on the substrate and the second gate layer.

\* \* \* \* \*